(12) United States Patent
Nadeau-Dostie

(10) Patent No.: US 7,194,669 B2
(45) Date of Patent: Mar. 20, 2007

(54) METHOD AND CIRCUIT FOR AT-SPEED TESTING OF SCAN CIRCUITS

(75) Inventor: Benoit Nadeau-Dostie, Gatineau (CA)

(73) Assignee: LogicVision, Inc., San Jose, CA (US)

( * ) Notice: Subject to any disclaimer, the term of this patent is extended or adjusted under 35 U.S.C. 154(b) by 413 days.

(21) Appl. No.: 10/739,055

(22) Filed: Dec. 19, 2003

(65) Prior Publication Data
US 2004/0163021 A1 Aug. 19, 2004

Related U.S. Application Data

(60) Provisional application No. 60/447,279, filed on Feb. 14, 2003.

(51) Int. Cl.
*G01R 31/28* (2006.01)
(52) U.S. Cl. .................................................. 714/726
(58) Field of Classification Search ................ 714/724, 714/726, 727, 729, 731, 732
See application file for complete search history.

(56) References Cited

U.S. PATENT DOCUMENTS

| | | | |
|---|---|---|---|
| 5,504,756 A * | 4/1996 | Kim et al. .................. | 714/729 |
| 5,574,733 A * | 11/1996 | Kim ........................... | 714/728 |
| 6,115,827 A | 9/2000 | Nadeau-Dostie et al. | |
| 6,145,105 A | 11/2000 | Nadeau-Dostie et al. | |
| 6,327,684 B1 | 12/2001 | Nadeau-Dostie et al. | |
| 6,327,685 B1 | 12/2001 | Koprowski et al. | |
| 6,442,722 B1 | 8/2002 | Nadeau-Dostie et al. | |
| 6,516,432 B1 * | 2/2003 | Motika et al. ............. | 714/732 |
| 2003/0084390 A1 * | 5/2003 | Tamarapalli et al. ........ | 714/744 |

* cited by examiner

*Primary Examiner*—James C. Kerveros
(74) *Attorney, Agent, or Firm*—Eugene E Prouix

(57) ABSTRACT

An improvement in a scan testing method for testing a circuit having memory elements arranged into one or more scan chains, the scan testing method having a shift phase for serially loading test patterns into the scan chains and serially unloading test response patterns from the scan chains and a capture phase for capturing the response of the circuit to the test pattern, includes, during the capture phase, connecting the serial output of each scan chain to its serial input and applying a predetermined number of capture clock cycles with the memory elements configured in a non-capture mode for all but the last capture clock cycle and configured in capture mode for the last capture clock cycle.

45 Claims, 9 Drawing Sheets

METHOD AND CIRCUIT FOR AT-SPEED TESTING OF SCAN CIRCUITS

CROSS-REFERENCE TO RELATED APPLICATIONS

This application claims the benefit of U.S. Provisional Patent Application Ser. No. 60/447,279 filed Feb. 14, 2003.

BACKGROUND OF THE INVENTION

1. Field of the Invention

The present invention relates, in general, to testing of integrated circuits and, more specifically, to a method and circuit for scan testing integrated circuits.

2. Description of Related Art

Scan circuits consist of logic and memory elements that are configurable in a scan mode and a capture mode. Scannable memory elements are organized in scan chains. Scan testing of scan circuits generally involves shifting a test pattern into scan chains of scannable memory elements in a circuit, capturing the response of the circuit during a capture cycle and then shifting the test response out of the circuit for analysis. The memory elements are configured in "shift mode" when test patterns are loaded and when test responses are unloaded and are configured in "capture mode" during the capture cycle. The capture mode corresponds to the normal operational mode of the memory elements.

Preferably, the clock used during capture cycle is an at-speed or system clock, in which the clock period is substantially the same as that used during normal operation of the circuit. In some cases, a higher clock frequency is desirable in order to compensate for favorable process and operating conditions.

It is known to be advantageous to apply several clock cycles during the capture phase in order to test for complex failure mechanisms such as power supply noise, IR-drop, signal coupling, etc., requiring an at-speed test. Applying several clock pulses during the capture phase is also required to test multi-cycle signal paths (MCPs).

Some scan testing methods are known to configure memory elements in capture mode for more than one capture clock cycle. However, doing so reduces fault coverage and increases computational effort (sequential fault simulation is required for any number of capture clock cycle in excess of one) because the final input stimulus applied to the circuit logic is a function of the circuit logic itself, not the test data loaded into the scan chains.

Applicants' prior U.S. Pat. Nos. 6,327,684 and 6,442,722, incorporated herein by reference, describe and claim methods in which memory elements are configured in a shift mode for all but the last clock cycle of the capture phase. However, these methods require a relatively complex interface between the scan chains and the test controller.

SUMMARY OF THE INVENTION

The present invention seeks to provide a method and circuit which allow a plurality of clock cycles during the capture phase or capture window while simplifying the complexity of the interface between scan chains and test controller, reducing computational effort and increasing fault coverage.

The method of the present invention allows to the application any number of clock cycles during the capture phase with the last cycle being a capture cycle. The method has a higher fault coverage and requires a lower computational effort than prior art methods which configure the memory elements in a capture mode for more than one cycle of the capture phase. The method also considerably simplifies the interface between the scan paths and the tester or test controller during the shift phase as compared against other methods that include a capture phase where the memory elements are configured in a shift mode for all but the last clock cycle of the capture phase. This is because the shift clock used during the shift phase can be chosen to be of slower or faster frequency than the clock used to perform the capture phase. For example, the shift clock might need to be slower to interface the scan chains to a tester or the shift clock might need to be higher to interface a test controller which interface with memory elements using a slow capture clock. Moreover, when scan chains are distributed over multiple clock domains, a common shift clock can be used that does not need to be related to the capture clocks used during the capture phase.

One aspect of the present invention is generally defined as an improvement in a scan testing method for testing a circuit having memory elements arranged into one or more scan chains, the scan testing method having a shift phase for serially loading test patterns into the scan chains and serially unloading test response patterns from the scan chains and a capture phase for capturing the response of the circuit to the test pattern, the improvement comprising: during the capture phase, connecting the serial output of each scan chain to its respective serial input; and applying a predetermined number of capture phase cycles to the memory elements with the memory elements being configured in a non-capture mode for all but the last clock cycle of the capture phase and configured in capture mode for the last capture clock cycle of the capture phase.

Another aspect of the present invention is generally defined as an improvement in an integrated circuit having combinational logic and memory elements arranged into scan chains having a respective serial input and a respective serial output and connected to the combinational logic for use in testing the circuit, the improvement comprising: a selector for each the scan chains responsive to a test phase control signal for selectively connecting either the serial output of each scan chain or a test pattern source to its respective serial input; and a sequencer circuit responsive to the test phase control signal and a clock signal for generating memory element configuration control signals for configuring the memory elements in non-capture mode for all but a last clock cycle of a capture phase of a scan test and in a capture mode for the last clock cycle of the scan test.

BRIEF DESCRIPTION OF THE DRAWINGS

These and other features of the invention will become more apparent from the following description in which reference is made to the appended drawings in which.

DETAILED DESCRIPTION OF PREFERRED EMBODIMENTS

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

Figure 1:
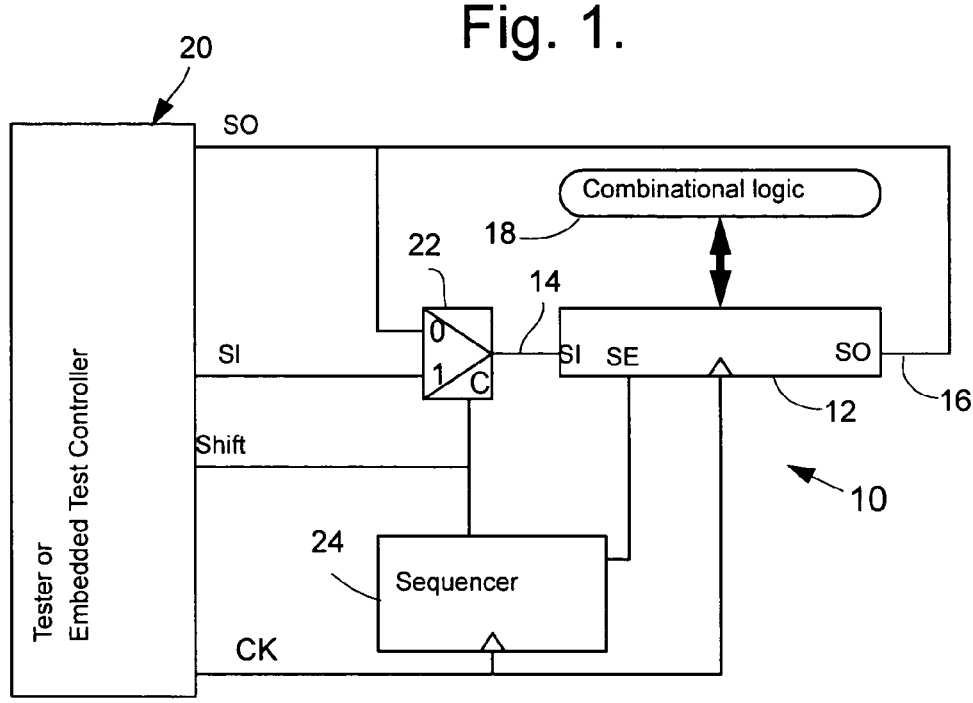
FIG. 1 diagrammatically illustrates a circuit with a single clock domain according to an embodiment of the present invention.

FIG. 1 illustrates a simple circuit 10 including one scan chain 12 having a serial input 14, a serial output 16, a scan enable input SE, and a clock input CK. The scan chain is comprised of a plurality of scannable memory elements connected to combinational circuit 18. In a manner well known in the art, the memory elements are configurable in a shift (or scan) mode or in a capture mode in response to a scan enable signal, SE. The shift mode is used for loading test data into the scan chain. The capture mode is used for capturing the response of the combinational logic to the test data. Typically, the input to a scan chain is connected to an output of a test controller 20, which may be an external tester or an embedded test controller. In FIG. 1, test controller 20 has an output labeled SI for loading a test pattern into the scan chain, and an input labeled SO which receives the serial output of the scan chain.

The present invention provides, for each scan chain, a multiplexer 22 which selects between a serial input SI provided by test controller 20 and the serial output 16 of the scan chain. Multiplexer 22 is controlled by a test phase control signal, labeled Shift, generated by the test controller.

An active value (logic 1) of the Shift signal indicates that a shift phase of a scan test is being initiated or is in progress and that the scan chain is being loaded with a new test pattern. Multiplexer 22 responds to an active value of the Shift signal by connecting the serial output SI of the test controller to the serial input 14 of the scan chain.

An inactive value (logic 0) of the Shift signal indicates that a capture phase of the scan test is being initiated or is in progress. Multiplexer 22 responds to an inactive value of the Shift signal by connecting the serial output of the scan chain to its serial input.

The present invention also provides a sequencer 24, which is responsive to the Shift signal and a clock signal CK, and generates memory element configuration control signals. In the embodiment of FIG. 1, the configuration control signals simply consist of the scan enable signal, SE, that is applied to each of the memory elements of the scan chain. The clock is common to the memory elements of the scan chain.

During the shift phase, the sequencer outputs an active scan enable signal SE to the scan chain. A sufficient number of shift clock cycles is applied to load test data into all memory elements of the scan chain. At the end of the shift phase, the Shift signal is switched to its inactive value to initiate the capture phase.

During the capture phase, the inactive value of the Shift signal causes multiplexer 22 to connect the serial output 16 of the scan chain to its serial input 14 and a predetermined number of clock cycles are applied to the memory elements of the scan chain. This causes rotation of the values in the scan chain by a number of positions determined by a number of clock cycles in which the scan chain may be configured in shift mode during the capture phase, as explained more fully below. In accordance with the present invention, the memory elements of the scan chain are configured in non-capture mode for all but the last cycle of the capture phase, and are configured in capture mode for the last capture clock cycle. In the embodiment of FIG. 1, the non-capture mode is a shift mode.

It will be understood by those skilled in the art that circuits may be designed with several scan chains. A sequencer can be shared by all scan chains, although different sequencers are provided for different scan chains which require different configuration control signals. However, each scan chain is provided with its own multiplexer 22.

Figure 2:
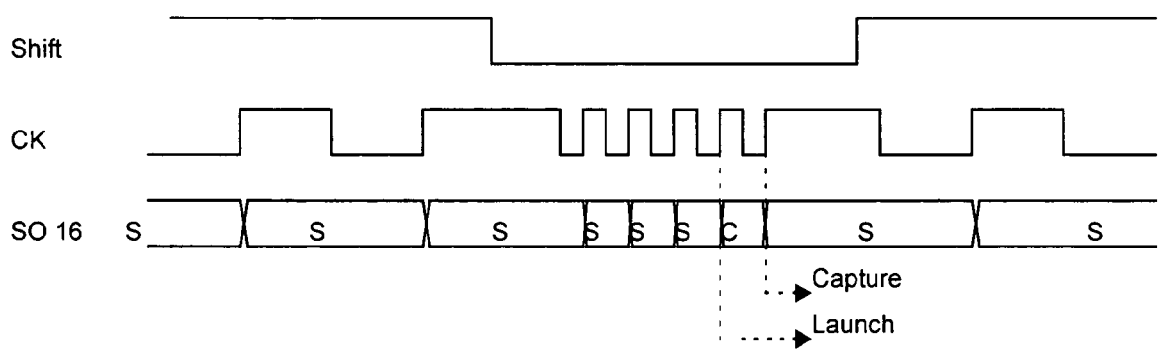
FIG. 2 is a timing diagram corresponding to the embodiment of FIG. 1.

FIG. 2 is a timing diagram corresponding to the series of events described above. The figure illustrates the behavior of the Shift signal, clock CK, and the serial output 16 of the scan chain. The waveforms are for memory elements which change state in response to a rising edge of the clock signal. The "S" and "C" symbols indicate a shift or capture configuration, respectively, of the memory elements and, further, indicate that the memory elements will perform a shift or capture operation in response to the next rising edge of the clock. Thus, it will be seen that, in this example, the capture phase comprises five capture clock cycles. The memory elements are configured in shift mode (S) in the first four cycles and in capture mode (C) for the last cycle.

It will be noted that a different clock may be used during the shift phase (Shift=1) from that used during the capture phase (Shift=0). This is useful in several situations. The shift clock used during the shift phase can be chosen to be of slower or faster frequency than the clock used during the capture phase. For example, the shift clock might need to be slower to interface the scan chains with a tester. The shift clock might need to be higher to interface a test controller interfacing with memory elements using a slow capture clock to reduce test time. Moreover, when scan chains are distributed over multiple clock domains, a common shift clock can be used that does not need to be related to the capture clocks used during the capture phase.

The present invention allows any number of clock cycles during the capture phase which ends with a capture cycle. Preferably, the clock cycles applied during the capture phase are applied at-speed, i.e., the clock period is substantially the same as that used during normal operation of the circuit or even higher to compensate for favorable process and operating conditions. The capability of applying several clock cycles during the capture phase is particularly useful when testing for complex failure mechanisms, such as power supply noise, IR-drop, and signal coupling, requiring an at-speed test. However, the method of the present invention provides higher fault coverage and requires lower computational effort than prior art methods which require configuring the memory elements in a capture mode for more than one cycle of the capture phase. This is because the final input stimulus applied to circuit logic is a function of the circuit logic itself, which causes a reduction in fault coverage and requires a sequential fault simulation for any number of clock cycle in excess of one.

Multi-Cycle Signal Paths (MCPs)

A second aspect of the present invention addresses the situation in which the circuit contains at least one memory element which is the source of a signal path that is longer than a capture clock period. These memory elements can be loaded at the same clock rate as memory elements which are the source of single-cycle paths. In the design of the circuit, multi-cycle signal path memory elements are grouped according to the propagation time of the signal paths that they source and the groups are organized in separate scan paths. Memory elements which source MCPs can be mixed with non-source memory elements provided that a mechanism is provided to bypass the source memory elements which are configured in hold mode while non-source memory elements are configured in shift mode. Such mechanism is described in Nadeau-Dostie et al. U.S. Pat. No. 6,145,105 issued on Nov. 7, 2000 for "Method and Apparatus for Scan Testing Digital Circuits", incorporated herein by reference.

During the capture phase, multi-cycle signal path memory elements, are configured in a non-capture mode which includes a shift mode and hold mode for all clock cycles of the capture phase except for the last cycle, the capture cycle. The memory elements are configured in a hold mode, prior to the capture cycle, for a predetermined number of capture clock cycles which is one less than the number of capture clock cycles required to propagate a value along the signal path to its destination. This is essentially the same as described and claimed in aforementioned U.S. Pat. No. 6,145,105.

Figure 3:
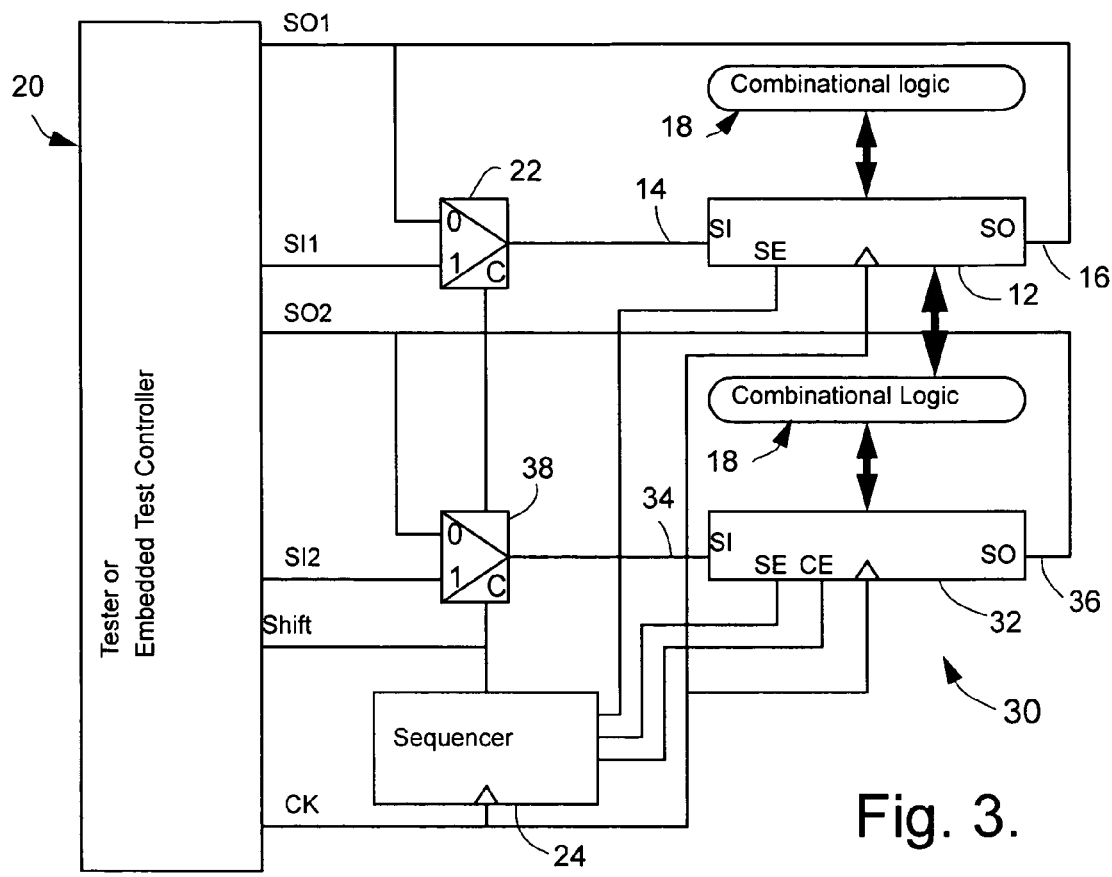
FIG. 3 diagrammatically illustrates a circuit with multi-cycle paths according to another embodiment of the present invention

FIG. 3 illustrates a simple circuit 30 to illustrate a multi-cycle path embodiment of the method to the present invention. The same reference numerals have been used to refer the same parts. The circuit includes a single cycle path scan chain 12 having a serial input 14 connected to serial output SI1 of the test controller and a serial output 16 connected to serial input SO1 of the test controller. The circuit also includes a multi-cycle scan chain 32 having a serial input 34 and a serial output 36 which is connected to a serial input SO2 of the test controller. Each memory element in scan chain 32 has the same signal propagation time as all other memory elements in the chain. Scan chains having multi-cycle paths require a capture enable control input, CE, that is provided by sequencer 24, in addition to the scan enable signal, SE, that is common to both scan chains 12 and 32. Each chain has its own multiplexer to select a serial input as mentioned above. Thus, scan chain 12 is provided with previously described multiplexer 20 and scan chain 32 is provided with a multiplexer 38 which has a first input connected to a serial output SI2 of the test controller and a second input connected to serial output 36 of scan chain 32. Multiplexer 38 is also controlled by the Shift signal.

Figure 4:
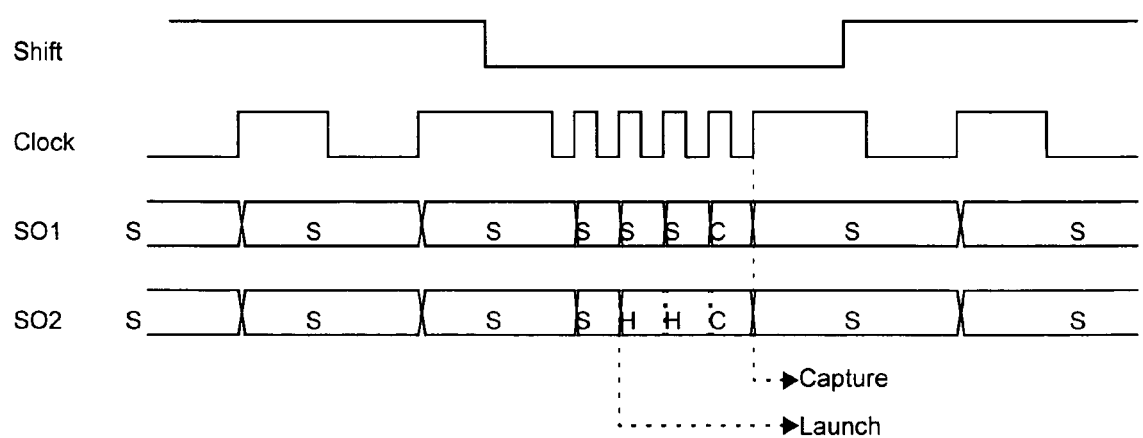
FIG. 4 is a timing diagram corresponding to the embodiment of FIG. 3.

FIG. 4 illustrates a timing diagram for the circuit of FIG. 3. The behavior of the single cycle path scan chain 12, as represented by SO1, is the same as that of the scan chain of FIG. 1. The output of multi-cycle scan chain 32 requires three capture clock cycles to propagate to the input of other memory elements which may be in either scan chain. Therefore, the memory elements of the multi-cycle scan chain 32 are configured in a hold mode (H) for two capture clock cycles prior to the capture cycle (C). Thus, it will be seen that, in this embodiment, the capture phase comprises five capture clock cycles. The memory elements are configured in shift mode (S) in the first two cycles, in hold mode for the next two cycles and in capture mode for the last cycle.

Some memory elements might source signals that have a very long propagation time and do not need to be accurately timed. These paths are generally known as "false paths". These memory elements are grouped in a separate scan chain and the sequencer configures them in a hold mode for all capture clock cycles except the last cycle of the capture phase, the capture cycle.

Adjustability

Another aspect of the present invention allows the number of capture clock cycles to be adjusted or specified for a test to facilitate diagnosis of complex failure mechanisms.

Figure 5:
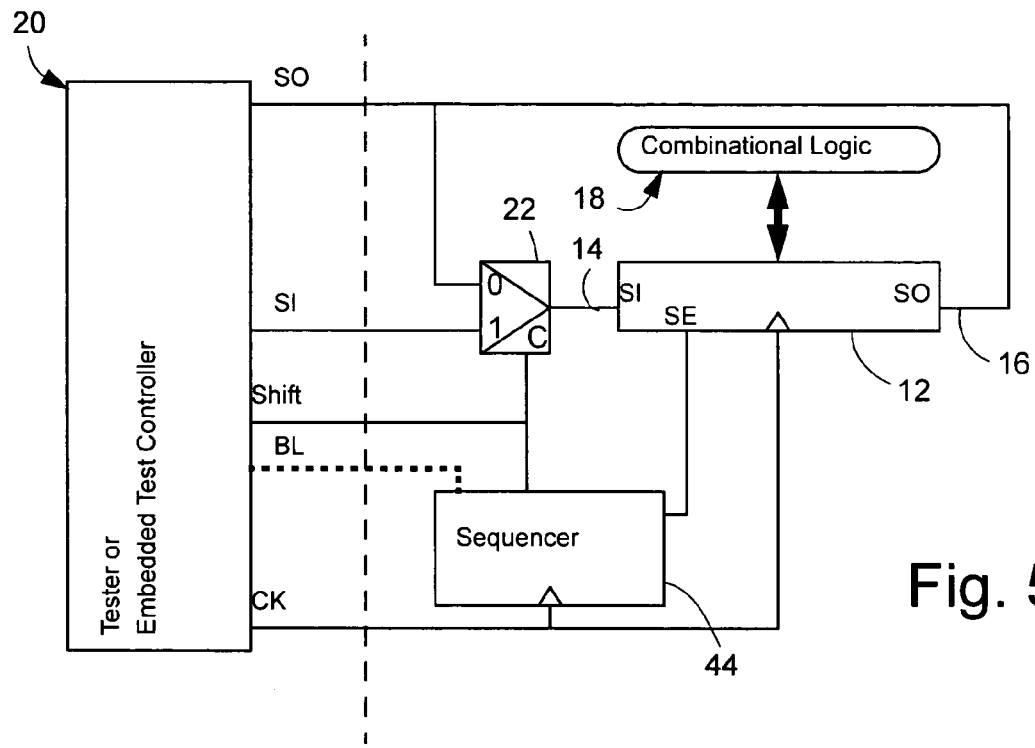
FIG. 5 diagrammatically illustrates shows a circuit supporting programmable capture burst length according to another embodiment of the present invention.
Figure 6:
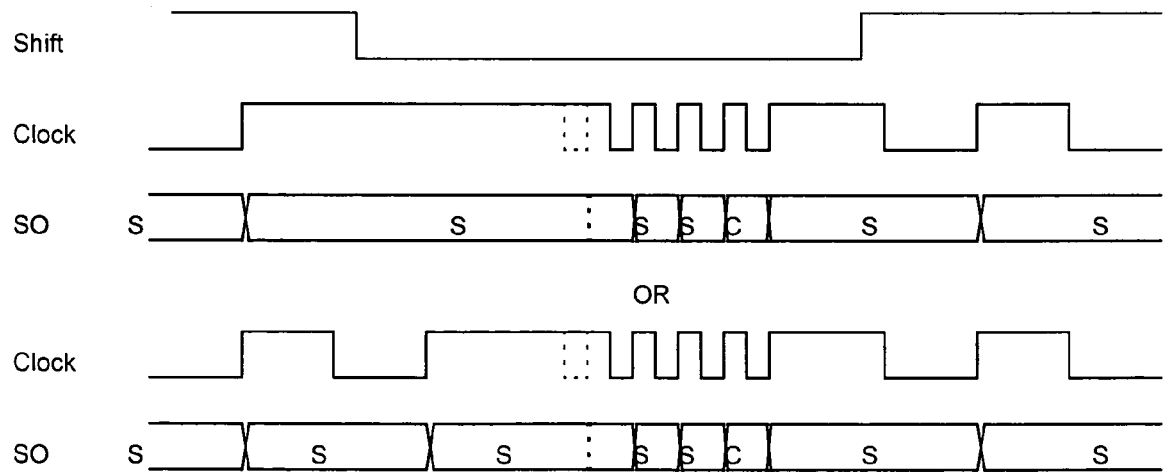
FIG. 6 is a timing diagram corresponding to the embodiment of FIG. 5.

FIG. 5 illustrates an embodiment in which a sequencer 44 receives a burst length signal, BL, as an input in addition to the clock signal CK and Shift signal. The burst length signal specifies the number of capture clock cycles to be applied during the capture phase and may be assigned any value up to a predetermined maximum burst length value. Thus, for example, if the maximum burst length has been predetermined to be 5, then BL can take any value between 1 and 5. The waveforms in the upper half of FIG. 6 illustrate an example in which the burst length has been set to 4. It will be understood that the maximum burst length can be more or less than 5 clock cycles and that the granularity of the burst length control can vary. For example, if the maximum burst length is 16, the BL signal could be arranged to allow burst length changes in increments of 4 instead of 1 to reduce the complexity of the sequencer.

Constant Output Response

The present invention can be used to maintain a constant circuit output response regardless of the number of capture clock cycles specified for the capture phase. This ensures that the value captured during the capture cycle is the same regardless of the burst length specified. This also simplifies the management of test patterns or signatures when different numbers of capture clock cycles are used for the same input patterns. In order to preserve the output response of the circuit for a variable number of capture clock cycles, a maximum number of capture clock cycles is first determined. This maximum is equal to the maximum burst length. If the desired number of capture clock cycles is less than the maximum burst length, shift clock cycles are added during the capture phase after the serial input of each scan chain has been connected to its serial output, so that the total number of clock cycles applied during the capture phase is the same as the maximum burst length.

Figure 7:
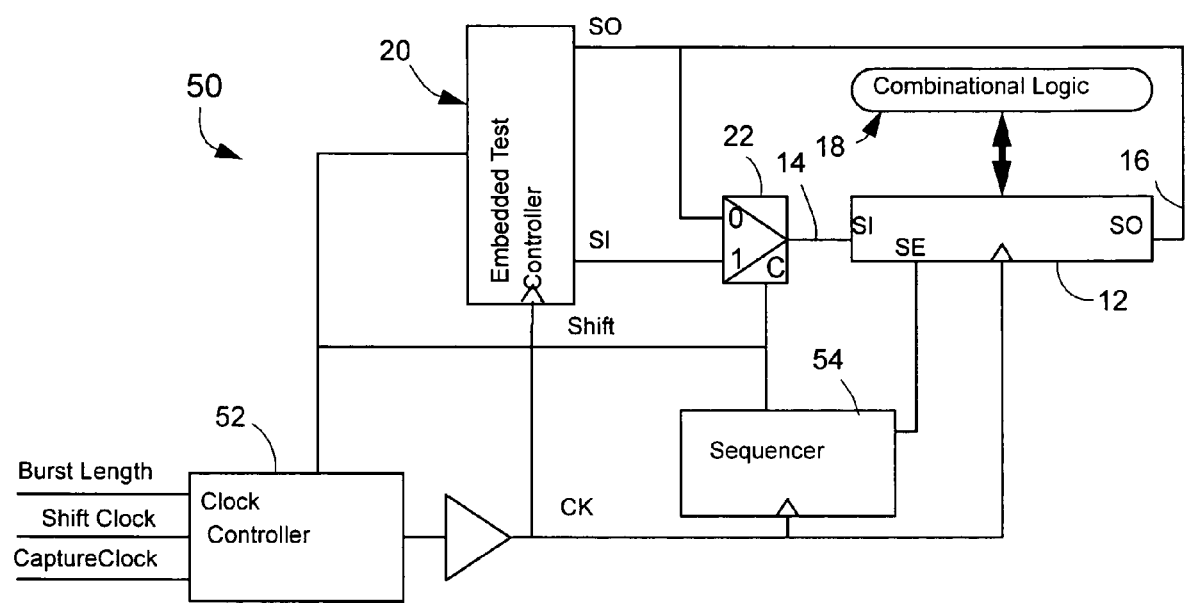
FIG. 7 diagrammatically illustrates shows a circuit supporting programmable capture burst length with constant output response, according to a further embodiment of the present invention.

FIG. 7 shows a circuit 50 which implements this option. The circuit includes a clock controller 52 which receives the burst length signal as well as shift clock and capture clock signals and outputs a clock signal having a constant number of clock cycles. Since the clock controller generates a constant number of clock cycles, sequencer 54 and the test controller 20 do not need to receive the burst length signal, as in the embodiment of FIG. 5. The lower half of FIG. 6 shows the corresponding waveforms obtained when using the clock controller of FIG. 7 with the same burst length value as in the example of FIG. 5, i.e., 4 and a maximum burst length value of 5. One capture clock cycle has been suppressed (shown in dotted lines), but one shift clock cycle has been added during the capture phase so that the total number of clock cycles during the capture phase is 5, including one shift clock cycle and four capture clock cycles.

Figure 8:
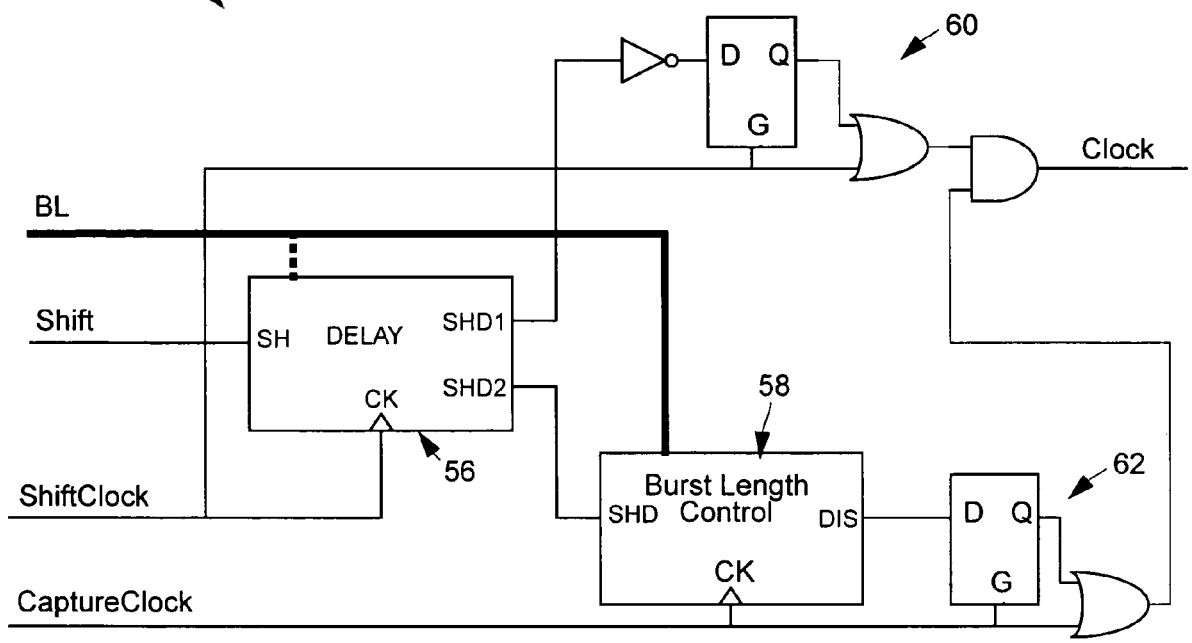
FIG. 8 diagrammatically illustrates a clock controller supporting programmable capture burst length, according to an embodiment of the present invention.
Figure 9:
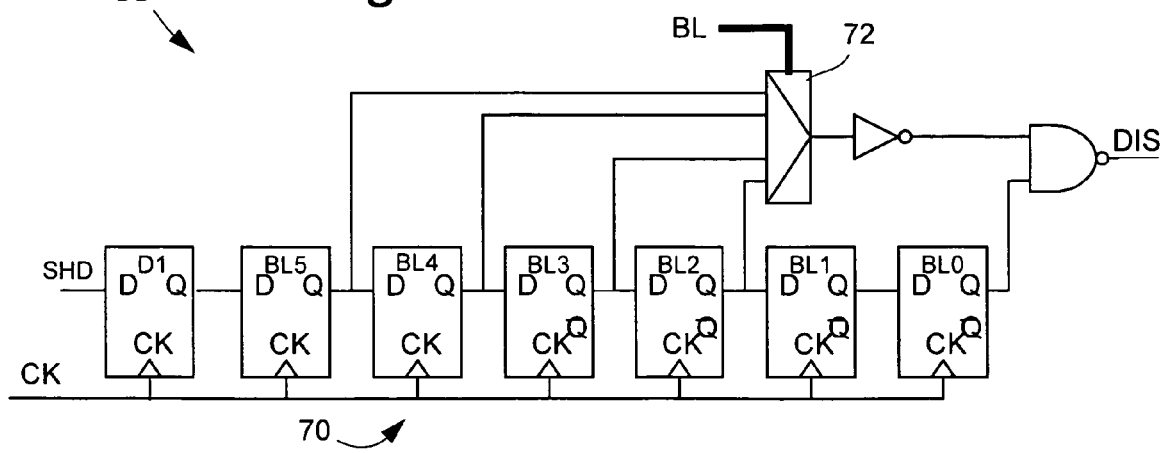
FIG. 9 diagrammatically illustrates a burst length control circuit of clock controller of FIG. 8, according to an embodiment of the present invention.

Clock controller 52 is illustrated in more detail in FIG. 8 and FIG. 9. The clock controller is comprised of a delay circuit 56, a burst length control circuit 58 and two clock gating circuits 60 and 62, one for the shift clock and one for the capture clock. Delay circuit 56 provides a delayed version of the Shift signal to shift clock gating circuit 60 and burst length control circuit 58. The delay can be different for the two circuits and, accordingly, the delay circuit is shown with two outputs. The delay can also be different for the rising and falling edge of the Shift signal. For example, a non-delayed version of the falling edge of the Shift signal is sent to the shift clock gating circuit to suppress shift clock pulses during the capture phase. However, a delayed version of the rising edge of the Shift signal can be sent to the shift clock gating circuit to postpone the re-enabling of the shift clock after the capture phase. This is useful when the frequency of the capture phase clock is modified for debugging purposes or when multiple clock controllers are used to control different clock domains. The delay on the rising edge of the Shift signal is chosen to guarantee that the capture phase is completed in all clock domains before the shift clock is re-enabled. As an alternative, an asynchronous handshake method can be used between the clock controllers as described in Applicant's U.S. Pat. No. 6,327,684 granted on Dec. 4, 2001 for "Method of Testing At Speed Circuits having Asynchronous Clocks and Controller for Use Therewith", incorporated herein by reference. In general, this handshake involves generating a DIS signal in all clock controllers and applying this signal to a circuit that waits for all DIS signals to go through a rising transition indicating the end of the capture burst. This circuit can be part of the test controller.

The delayed version, SHD2, of the Shift signal is sent to the burst length control circuit 58. The delay must be sufficient to eliminate any critical timing. Additional delay might be required when the capture burst length is modified and shift clock cycles are added during the capture phase to keep the total number of clock cycles constant during the capture phase. Note that the burst length control circuit is sensitive only to the falling edge of the Shift signal as will be seen in FIG. 9.

FIG. 9 illustrates an embodiment of a burst length control circuit 58 according to the present invention. The circuit includes a capture clock cycle generator in the form of a shift register 70 comprised of several memory elements. The first two memory elements, D1 and BL5, which function as a synchronizer, as explained below, are optional and are necessary only when, the delayed version of the Shift signal, SHD, is asynchronous with respect to the clock CK. The remaining memory elements, labeled BL1 to BL5, and their output provide a specified burst length when selected by a multiplexer 72 under control of the burst length signal BL. The number of these memory elements corresponds to the predetermined maximum burst length value.

A falling edge of the delayed Shift signal will cause an inactive value of the output signal DIS to appear after two rising edges of the capture clock. An inactive value of DIS enables the capture clock. Once the falling edge of the delayed Shift signal reaches the output of the selected memory element (BL2 to BL5), an active value of signal DIS appears at the output. An active value of DIS disables the capture clock.

The delayed version of the Shift signal can be implemented using a simple shift register or a counter for longer delays. Similarly, the clock burst control circuit can use a counter instead of the shift register shown in FIG. 9 for longer clock bursts.

Multiple Clock Domains

A further issue to consider is interaction among multiple clock domains. Three types of interaction that are of particular concern. These are asynchronous clock domains, synchronous clock domains that are skewed with respect to each other and synchronous clock domains. The first two types are handled in the same manner.

Asynchronous Clock Domains/Skewed Synchronous Clock Domains

The following description relates to asynchronous clock domains or synchronous clock domains that are skewed with respect to each other. These are situations in which a circuit contains at least one signal path sourced by a memory element in a first clock domain and received by at least another memory element of a second clock domain. This situation is handled using the method described and claimed in Applicants' U.S. Pat. No. 6,115,827 issued on Sep. 5, 2000 for "Clock Skew Management Method and Apparatus", incorporated herein by reference.

Figure 10:
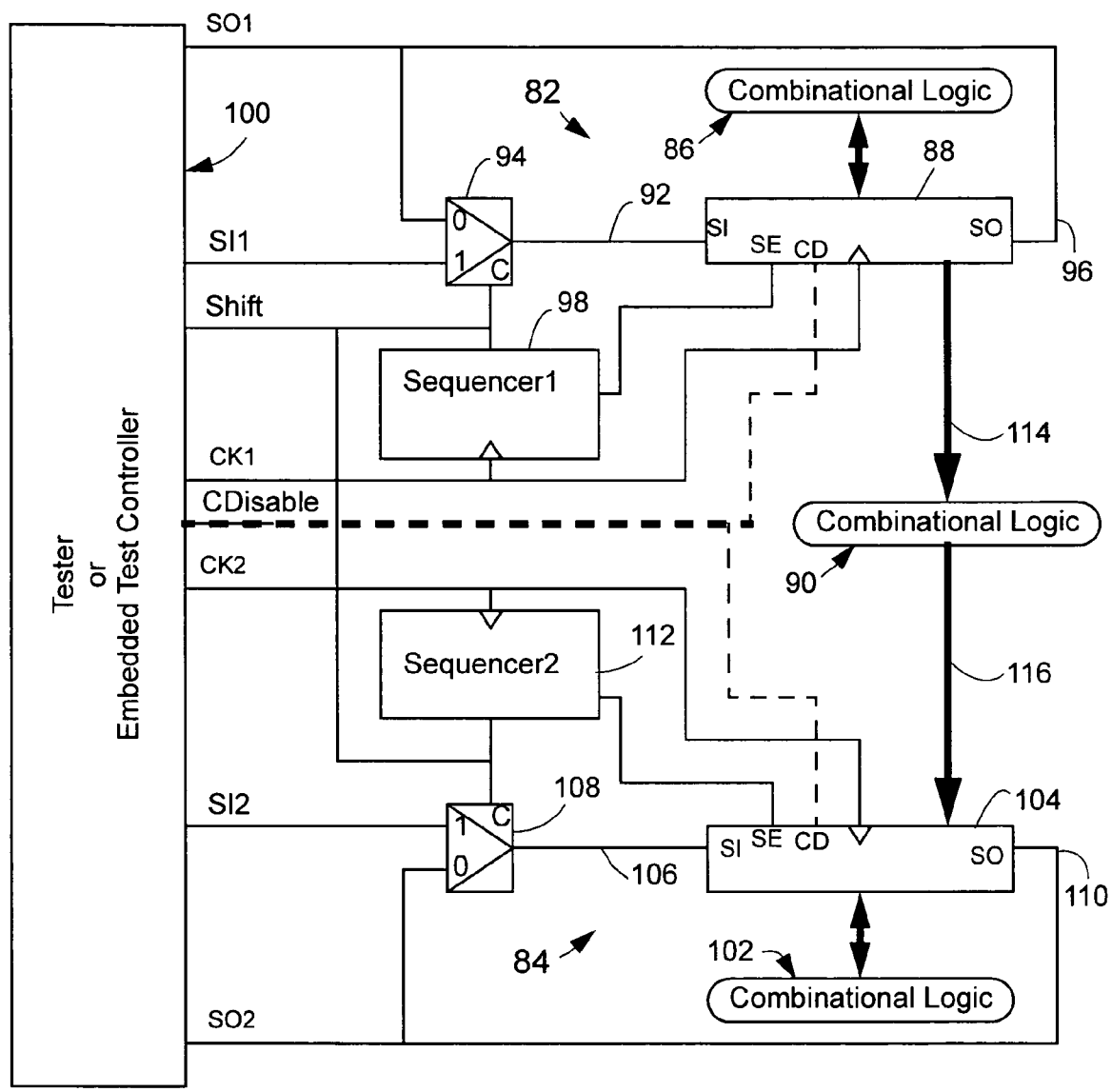
FIG. 10 diagrammatically illustrates a circuit with interacting clock domains incorporating the invention, according to an embodiment of the present invention.

FIG. 10 shows a circuit 80 with two clock domains 82 and 84. First clock domain 82 operates under control of clock CK1 and includes combinational logic 86 and a scan chain 88 with memory elements connected to combinational logic 86 and 90. Scan chain 88 has a serial input 92 connected to the output of multiplexer 94 and a serial output 96 connected to one input of the multiplexer and to input SO1 of test controller 100. The other input of multiplexer 94 is connected to output SI1 of the test controller. A sequencer 98, such as any of the sequencers described earlier, is associated with clock domain 82.

Similarly, second clock domain 84 operates under control of clock CK2 and includes combinational logic 102 and a scan chain 104 with memory elements connected to combinational logic 102 and 90. Scan chain 104 has a serial input 106 connected to the output of multiplexer 108 and a serial output 110 connected to one input of multiplexer 108 and to input SO2 of test controller 100. The other input of multiplexer 108 is connected to output SI2 of the test controller. A sequencer 112, such as any of the sequencers described earlier, is associated with clock domain 84.

Bold lines 114 and 116 represent one or more signal paths which originate at the output of a source memory element in first clock domain 82 and terminate at the input of one or more destination memory elements in second clock domain 84. A control signal CDisable output by test controller 100 determines which of the source or destination memory element is allowed to be configured in a capture mode during the capture phase. The CDisable lines are shown in dotted lines because the same circuit is used for synchronous clock domains but without the CDisable signals. For a first value of the control signal, source memory elements are configured in a hold mode for all clock cycles of the capture phase using the scan enable SE and capture disable, CD, signal as input. For a second value of the control signal, the destination memory elements are configured in a shift or hold mode during the capture cycle using the scan enable SE and capture disable CD signal.

Figure 11:
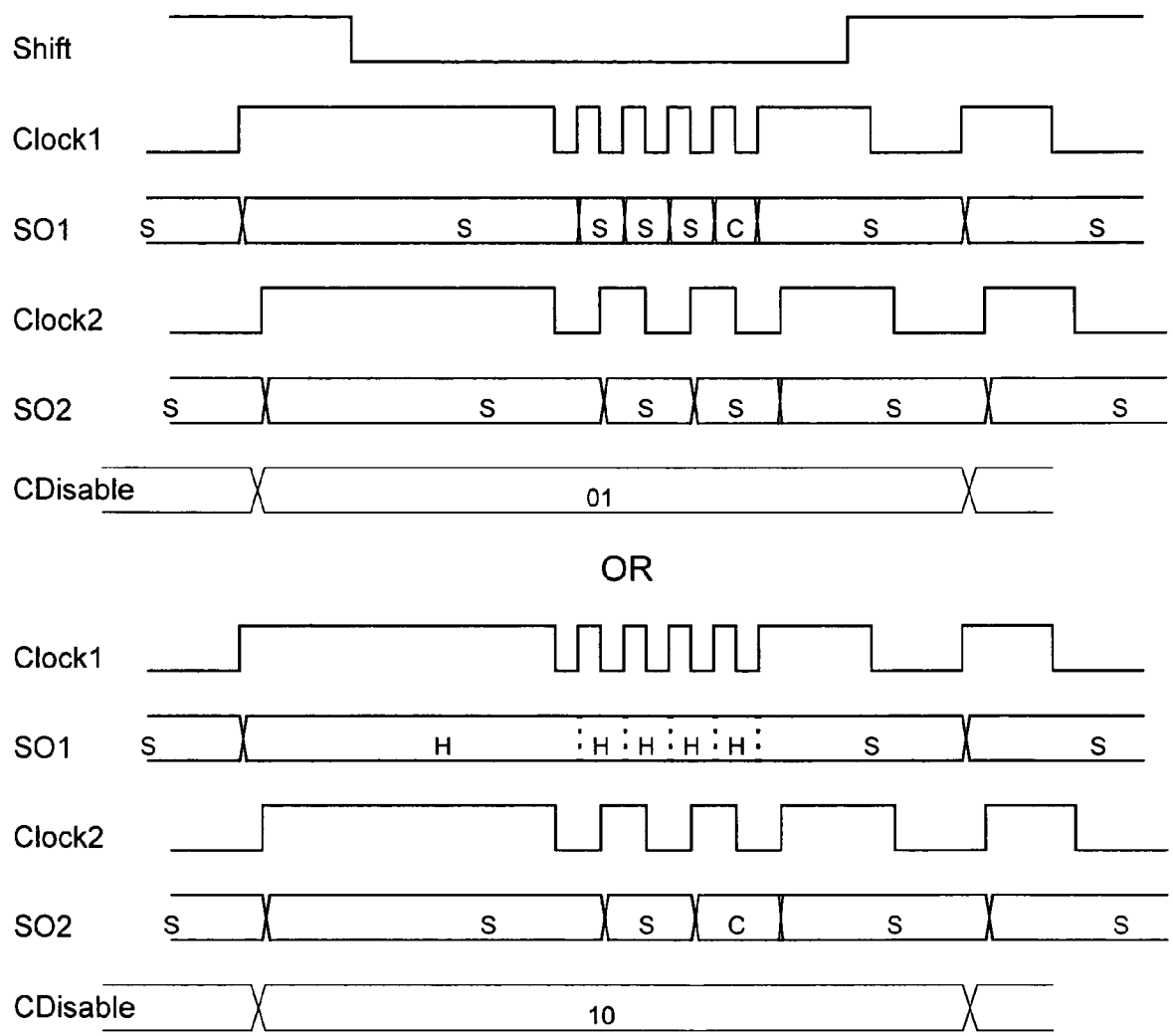
FIG. 11 is a timing diagram corresponding to the embodiment of FIG. 10.

FIG. 11 shows the waveforms corresponding to the circuit of FIG. 10. The top half of the figure shows the waveforms for source memory elements in first clock domain 82, represented by waveform SO1, indicating that the source memory elements will be configured in a capture mode in the last cycle of the capture phase. Destination memory elements in clock domain 84, represented by waveform SO2, have their capture cycle suppressed by configuring them in shift mode. The destination memory elements could alternatively be configured in hold mode. The value of the control signal CDisable would be "01" for this case. Source memory elements can be on a separate scan chain or can be included with other non-source memory elements provided that a mechanism is provided to bypass the source memory elements which are configured in hold mode while non-source memory elements are configured in shift mode, as previously mentioned. Destination memory elements can easily be included on a same scan chain with non-destination memory elements if configured in shift mode to suppress the capture cycle. They are treated like source memory elements if configured in hold mode to suppress the capture cycle.

The bottom half of FIG. 11 shows the case where the destination memory elements are configured in a capture mode during the capture phase and the source memory elements are configured in a hold mode to ensure that the destination memory elements capture a known and predictable value. The value of the control signal CDisable would be "10" for this case.

In the illustrated embodiment, the two capture clocks used during the capture phase can be asynchronous to each other and the sequencers can implement a different capture burst length values.

Aligned Synchronous Clock Domains

Figure 12:
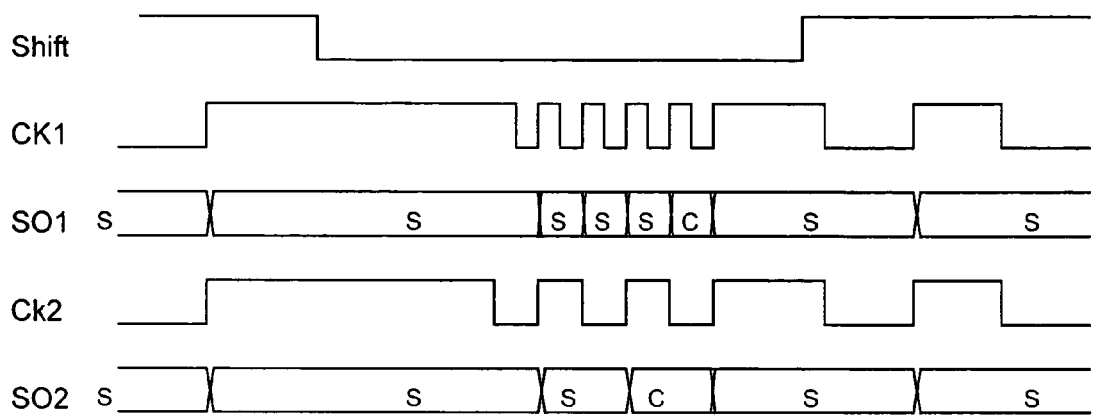
FIG. 12 is a timing diagram for two synchronous clock domains according to an embodiment of the present invention.
Figure 13:
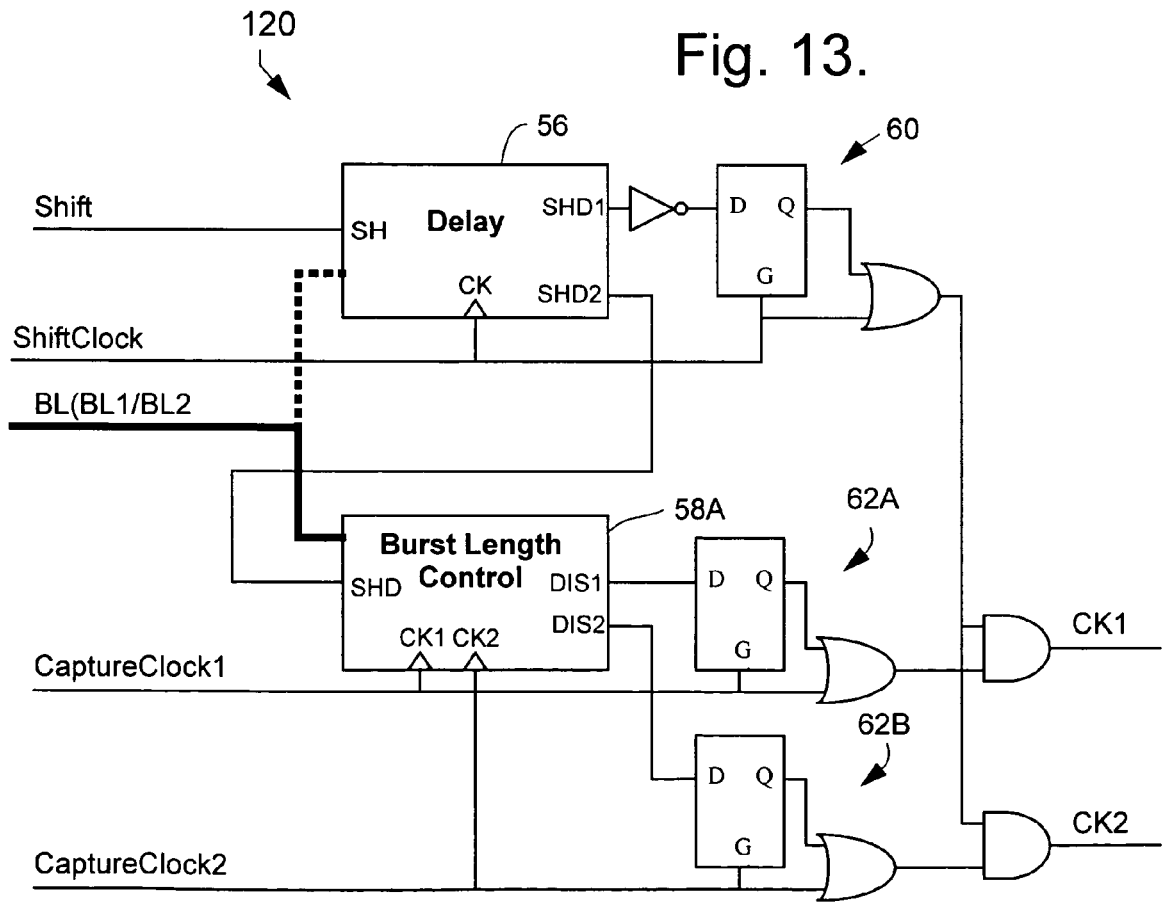
FIG. 13 is a diagrammatic view of a clock controller for use in a circuit having two synchronous clock domains, according to an embodiment of the present invention.
Figure 14:
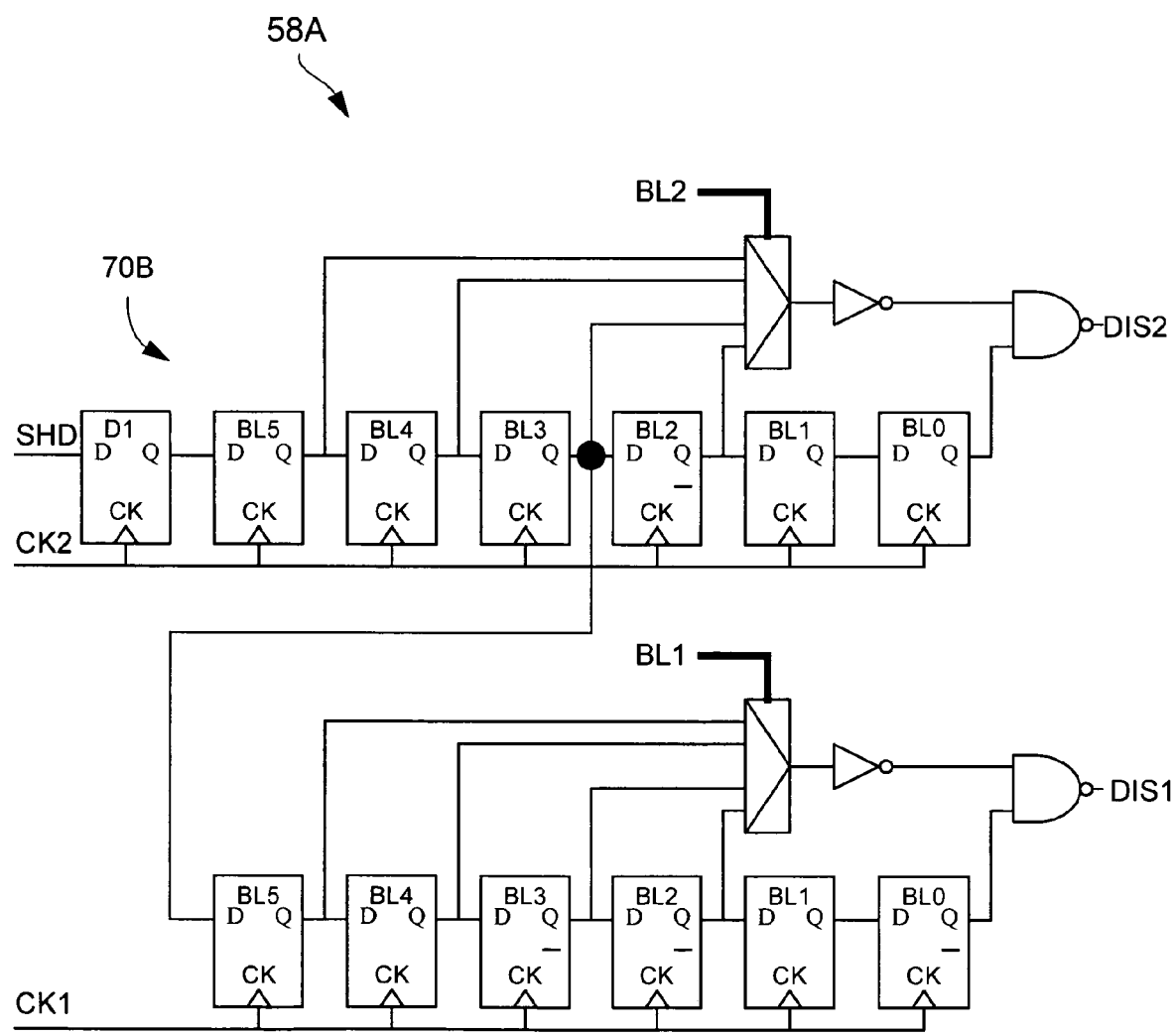
FIG. 14 is a circuit diagram of one embodiment of a burst length control circuit for use in the clock controller of FIG. 13.

With synchronous clock domains which are aligned during normal operation and which are to be tested with aligned clocks in test mode, it is necessary to ensure that the last capture clock cycle, the capture cycle, of the capture phase occurs simultaneously in all interacting synchronous clock domains, as shown by the waveforms of FIG. 12. FIGS. 13 and 14 illustrate circuitry by which this may be achieved when practicing the present invention.

FIG. 13 is a high level view of a clock controller 120 for generating the waveforms of FIG. 12 for two interacting synchronous clock domains. The clock controller is essentially the same as that of FIG. 8 except that burst length control block 58A outputs two capture clock disable signals, DIS1 and DIS2, that are connected to capture clock gating circuits, 62A and 62B, respectively, which generate clocks CK1 and CK2. Burst length control block 58A is illustrated in more detail in FIG. 14, and is essentially the same as that of FIG. 9. The circuit of FIG. 9 suppresses the first capture clock cycles instead of those at the end. This consideration is important in the case capture cycles must occur simultaneously in interacting synchronous clock domains whose clocks are aligned. However, in the case of a single clock domain or interacting clock domains, synchronous or asynchronous, whose clocks are not aligned, it is acceptable to suppress the last capture clock cycles instead of those at the beginning.

FIG. 14 illustrates one embodiment of burst length control block 58A which includes a shift register 70A associated with high frequency clock CK1 and a shift register 70B associated with low frequency clock CK2. As in the embodiment of FIG. 9, the shift registers serve as capture clock generators. The basic principle of burst length control circuit 58A of FIG. 14 is that the capture clock with the lowest frequency (CK2/CaptureClock2) is used to synchronize the delayed Shift signal output from delay block 56 and provide a common point of reference for the two clock domains. The capture clock burst of low frequency clock CK2 is generated by selecting the appropriate output of the shift register 70B according to the value of burst length control signal BL2, as described previously in the description of FIG. 9. The input to shift register 70A, used to generate the capture clock burst of high frequency clock CK1, is connected to an output, BL3, of shift register 70B. The output is selected such that the time taken to propagate a signal from the selected output to the end of both shift registers, 70A and 70B, is the same irrespective of the burst lengths selected for the clock domains. This will ensure that the last capture clock cycle occurs simultaneously in both clock domains. It is advantageous to select an output that is as close as possible to the end of low frequency shift register 70B so that the length of shift register 70A is minimized.

Circuits that include more than two synchronous clock domains would include a capture clock generator, such as shift registers 70A and 70B, for each additional clock domain which may receive an output, similar to output BL3, from a lower frequency capture clock generator. Alternatively, all capture clock generators associated with higher frequency clocks could receive output BL3 of the capture clock generator associated with the lowest frequency, shift register 70B, and be provided with appropriate means to ensure that the capture cycles occur simultaneously in all domains.

The frequency ratio of clocks CK1 and CK2 must be considered for the output selection. In the case illustrated, the frequency of clock CK2 is half that of clock CK1. The output of memory element BL3 of shift register 70B is selected as the input to shift register 70A because it takes three CK2 clock periods to propagate a signal from that output to the end of shift register 70B which is the same amount of time as six CK1 clock periods to propagate a signal from that output (BL3) to the end of shift register 70A. Any integer clock ratio can be handled by this method. More than two clock domains with aligned synchronous clocks can be handled in the manner described above.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

I claim:

1. An improvement in a scan testing method for testing a circuit having memory elements arranged into one or more scan chains, each scan chain having a serial input and a serial output, said scan testing method having a shift phase for serially loading test patterns into said scan chains and serially unloading test response patterns from said scan chains and a capture phase for capturing the response of said circuit to said test pattern, the improvement comprising:

during said capture phase, connecting the serial output of each scan chain to its respective serial input; and applying a predetermined number of clock cycles with said memory elements being configured in a non-capture mode for all but the last clock cycle of said capture phase and being configured in capture mode for the last clock cycle of said capture phase.

2. A method as defined in claim 1, further including:
generating a test phase control signal for defining said shift phase and said capture phase and enabling a capture clock in response to a predetermined transition of said test phase control signal and generating said predetermined number of clock cycles.

3. A method as defined in claim 2, further including, for a circuit having two or more interacting synchronous clock domains which are aligned during normal operation, during a test mode of said circuit, generating said predetermined number of clock cycles in each clock domain at respective capture clock rates so that said last clock cycle in said clock domains occurs simultaneously in said clock domains.

4. A method as defined in claim 3, further including synchronizing said test phase control signal using the capture clock signal of a clock domain having the lowest clock frequency to produce a synchronized test phase control signal and generating a signal derived from said synchronized test phase control signal such that the time required for the derived signal to propagate to a maximum output of each domain is the same.

5. A method as defined in claim 1, said applying a predetermined number of clock cycles including rotating values in said scan chains by a number of positions determined the number of clock cycles during the capture phase in which said non-capture mode is a shift mode.

6. A method as defined in claim 1, further including, for each multi-cycle scan chain comprised of memory elements which source a multi-cycle path of a predetermined number of cycles, said capture phase including, prior to said last capture clock cycle, configuring said memory elements in a hold mode for a number of capture clock cycles equal to one less than said predetermined number of cycles.

7. A method as defined in claim 1, further including, for each scan chain comprised of memory elements which source a multi-cycle path of a predetermined number of cycles and non-source memory elements, said capture phase including, prior to said last capture clock cycle, configuring said memory elements in a hold mode for a number of capture clock cycles equal to one less than said predetermined number of cycles and bypassing said multi-cycle path source elements when configured in hold mode.

8. A method as defined in claim 1, further including, prior to starting a test, specifying a number of cycles of a capture clock to be generated during said capture phase.

9. A method as defined in claim 8, further including, adjusting the number of clock cycles during said capture phase when the number of capture clock cycles specified is less than a maximum number of capture clock cycles so that the total number of cycles applied during said capture phase equals said maximum number of capture clock cycles.

10. A method as defined in claim 9, said adjusting the number of clock cycles during said capture phase comprising preceding a specified number of cycles of said capture clock with a number of shift clock cycles so as to provide said maximum number of capture phase clock cycles.

11. A method as defined in claim 1, further including, for a circuit having two or more interacting asynchronous clock domains or clock domains having skewed synchronous clocks, for each signal path sourced by a source memory element residing in a first clock domain and received by one or more destination memory elements residing in another clock domain, generating a control signal specifying which of said source memory element and said destination memory elements is to be configured in a capture mode during said capture phase.

12. A method as defined in claim 11, further including, for a first value of said control signal, configuring source memory elements in a hold mode for all clock cycles of said capture phase and for a second value of said control signal, configuring destination memory elements in a shift mode or a hold mode during said capture cycle.

13. A method as defined in claim 1, further including repeating said method for each of a plurality of test patterns.

14. A method as defined in claim 1, further including:
observing at a circuit output the output response stored in said memory elements at the end of said capture phase concurrently with the loading of the new test pattern applied at a circuit input.

15. A scan testing method for use in testing a circuit having memory elements arranged into one or more scan chains with each scan chain having a serial input and a serial output, said scan testing method comprising:
a shift phase for loading test patterns into said scan chains and unloading test response patterns from said circuit, said shift phase including configuring said memory elements in a shift mode, connecting the serial input of each scan chain to a circuit input, connecting the serial output of each scan chain to a circuit output, and applying a sufficient number of shift clock cycles to said memory elements so as to load a test pattern into each said memory elements; and
a capture phase for capturing the response of said circuit to said test pattern, including connecting the serial output of each scan chain to its serial input, and applying a predetermined number of capture clock cycles to said memory elements, configuring said memory elements in a non-capture mode for all but a last of said capture clock cycles and configuring said memory elements in a capture mode for said last of said capture clock cycles.

16. A method as defined in claim 15, further including:
generating a test phase control signal for defining said shift phase and said capture phase and enabling a capture clock in response to a predetermined transition of said test phase control signal and generating said predetermined number of clock cycles.

17. A method as defined in claim 16, further including, for a circuit having two or more interacting synchronous clock domains which are aligned during normal operation, during a test mode of said circuit, generating said predetermined number of clock cycles in each clock domain at respective capture clock rates so that said last clock cycle in said clock domains occurs simultaneously in said clock domains.

18. A method as defined in claim 17, further including synchronizing said test phase control signal using the capture clock signal of a clock domain having the lowest clock frequency to produce a synchronized test phase control signal and generating a signal derived from said synchronized test phase control signal such that the time required for the derived signal to propagate to a maximum output of each domain is the same.

19. A method as defined in claim 15, further including, for each multi-cycle scan chain comprised of memory elements which source multi-cycle paths of a predetermined number of cycles, said capture phase including, prior to said last capture clock cycle, configuring said memory elements in a hold mode for a number of capture clock cycles equal to one less than said predetermined number of cycles.

20. A method as defined in claim 19, further including, prior to starting a test, specifying the number of capture clock cycles to be included in said capture phase.

21. A method as defined in claim 20, further including, adjusting the number of clock cycles during said capture phase for the specified number of capture clock cycles to provide a maximum number of capture phase clock cycles.

22. A method as defined in claim 21, said adjusting the number of clock cycles during said capture phase comprising preceding a specified number of capture clock cycles with a number of shift clock cycles so as to provide said maximum number of capture phase clock cycles.

23. A method as defined in claim 15, further including, for each scan chain comprised of memory elements which source a multi-cycle path of a predetermined number of cycles and non-source memory elements, said capture phase including, prior to said last capture clock cycle, configuring said memory elements in a hold mode for a number of capture clock cycles equal to one less than said predetermined number of cycles and bypassing said multi-cycle path source elements when configured in hold mode.

24. A method as defined in claim 15, further including, for each signal path sourced by a source memory element residing in a first clock domain and received by one or more destination memory elements residing in another clock domain, generating a control signal specifying which of said source memory element and said destination memory elements is allowed to be configured in a capture mode during said capture phase.

25. A method as defined in claim 24, further including, for a first value of said control signal, configuring source memory elements in a hold mode for all clock cycles of said capture phase and for a second value of said control signal, configuring destination memory elements in a shift mode or a hold mode during said capture cycle.

26. An integrated circuit having combinational logic and memory elements arranged into scan chains having a respective serial input and a respective serial output and connected to said combinational logic for use in testing said circuit comprising:
a selector for each said scan chains responsive to a test phase control signal for selectively connecting either the serial output of each scan chain or a test pattern source to its respective serial input; and
a sequencer circuit responsive to said test phase control signal and a clock signal for generating memory element configuration control signals for configuring said memory elements in non-capture mode for all but a last clock cycle of a capture phase of a scan test and in a capture mode for said last clock cycle of said scan test.

27. An integrated circuit as defined in claim 26, said sequencer circuit including a sequencer circuit for each clock domain in said integrated circuit.

28. An integrated circuit as defined in claim 26, for each multi-cycle scan chain comprised of memory elements which source a multi-cycle path of a predetermined number of cycles, said sequencer being operable to configure, prior to a capture cycle, said multi-cycle path source elements in a hold mode for a number of capture clock cycles equal to one less than said predetermined number of cycles.

29. An integrated circuit as defined in claim 26, for each scan chain comprised of memory elements which source a multi-cycle path of a predetermined number of cycles and non-source memory elements, said sequencer being operable to configure, prior to a capture cycle, said multi-cycle path source elements in a hold mode for a number of capture clock cycles equal to one less than said predetermined number of cycles and bypassing said multi-cycle path source elements when configured in hold mode.

30. An integrated circuit as defined in claim 26, said sequencer circuit being operable to generate memory element configuration control signals for configuring said memory elements in shift mode during a shift phase of a scan test.

31. An integrated circuit as defined in claim 26, said non-capture mode being a shift mode or a hold mode.

32. An integrated circuit as defined in claim 26, said sequencer circuit being responsive to a burst length control signal indicative of the number of capture clock cycles to be applied during said capture phase for configuring said memory elements in non-capture mode for all but a last clock cycle of said capture phase and in a capture mode for said last clock cycle.

33. An integrated circuit as defined in claim 26, said capture phase having a predetermined maximum number of clock cycles.

34. An integrated circuit as defined in claim 26, further including a clock controller responsive to a shift clock and a capture clock for generating a clock signal to be applied to said sequencer and said memory elements during said shift phase and said capture phase, respectively.

35. An integrated circuit as defined in claim 34, said clock controller being further responsive to a burst length control signal indicative the number of capture clock cycles to be applied to said memory elements during said capture phase for generating a clock signal containing said number of capture clock cycles during said capture phase.

36. An integrated circuit as defined in claim 34, said clock controller including:
a delay circuit responsive to said shift clock and a test phase control signal for generating a first and a second delayed test phase control signals;
a first gating circuit responsive to said first delayed test phase control signal and said shift clock for generating shift clock pulses;
a burst length control circuit responsive to a burst length control signal, said second delayed test phase control signal and said capture clock for generating capture clock disabling signals; and
a second gating circuit responsive to capture clock disabling signals and said capture clock for generating capture clock pulses during said capture phase.

37. An integrated circuit as defined in claim 36, wherein the delay of said first delayed test phase control signal is shorter than the delay of said second delayed test phase control signal.

38. An integrated circuit as defined in claim 36, wherein the delay of said first delayed test phase control signal or both said first and said second delayed test phase control signal is zero.

39. An integrated circuit as defined in claim 36, said burst length control circuit including a synchronizer for synchronizing said second delayed test phase control signal and said capture clock for generating a capture clock enabling signal for enabling said capture clock in response to a predetermined edge of said second test phase control signal and means responsive to a predetermined number of capture clock pulses for generating a capture clock disabling signal for disabling said capture clock.

40. An integrated circuit as defined in claim 39, said means responsive to a predetermined number of capture clock pulses including a shift register having a plurality of serially connected shift register elements and a multiplexer responsive to said burst length control signal for selecting the output of one of said shift register elements and outputting a capture clock disabling output.

41. An integrated circuit as defined in claim 39, said means responsive to a predetermined number of capture clock pulses including a counter.

42. An integrated circuit as defined in claim 26, further including, for a circuit having two or more clock domains with signals traversing domain boundaries:
   each said clock domain having a respective sequencer circuit for generating memory element configuration control signals in said clock domain, each said sequencer circuit being responsive to a test phase control signal and a respective clock signal; and
   each memory element which sources a signal which traverses a clock domain boundary and each destination memory element which is recipient of a signal which traverses a domain boundary being responsive to a capture control signal which determines which of a source memory element and its corresponding destination memory elements will be configured in capture mode and which will be configured in a non-capture mode during said capture cycle of said capture phase.

43. An integrated circuit as defined in claim 42, said capture control signal having a first value of said control signal, configuring source memory elements in a hold mode for all clock cycles of said capture phase and a second value of said control signal, configuring destination memory elements in a shift mode or a hold mode during said capture cycle.

44. An integrated circuit as defined in claim 34, for a circuit having two or more interacting synchronous clock domains having respective capture clocks, said clock controller including:
   a synchronizer for synchronizing the test phase control signal using the capture clock signal of a clock domain having the lowest clock frequency and having an output for a synchronized test phase control signal;
   a capture clock cycle generator for each synchronous clock frequency having an input, and a plurality of outputs selectable under control of respective a burst length control signal, one output of said plurality of outputs being connected to the input of a capture clock cycle generator associated with a higher synchronous clock frequency; said synchronized test phase control signal being connected to the input of the capture clock cycle generator of the clock domain having the lowest frequency, and said one output of said capture clock cycle generator being such that the time required for a signal to propagate from said one output to said a last output of said plurality of outputs being equal to the time required for a signal to propagate from said one input of a next capture clock cycle generator to the last output of said plurality of outputs of said next capture clock cycle generator.

45. An integrated circuit as defined in claim 34, for a circuit having two or more interacting synchronous clock domains having respective capture clocks, said clock controller including:
   a synchronizer for synchronizing the test phase control signal using the capture clock signal of a clock domain having the lowest clock frequency and having an output for a synchronized test phase control signal;
   a capture clock cycle generator for each synchronous clock frequency and having an input, and a plurality of outputs selectable under control of respective burst length control signals and including capture clock cycle generator associated with a clock domain having the lowest clock frequency having its input connected to said synchronized test phase control signal and producing a further control signal; and
   each capture clock cycle generator associated with a clock domain having a higher clock frequency having its input connected to said further control signal;
   each said capture clock cycle generator associated with a clock domain having higher clock frequency being operable to propagate a signal applied to its input to a respective last output of said plurality of outputs in the same time required for said capture clock cycle generator associated with the clock domain having the lowest frequency to propagate said further control signal to its respective last output of its plurality of outputs.

* * * * *